United States Patent
Wu et al.

(10) Patent No.: US 8,528,195 B2
(45) Date of Patent: Sep. 10, 2013

(54) LAYOUT METHOD FOR ELECTRONIC COMPONENTS OF DOUBLE-SIDED SURFACE MOUNT CIRCUIT BOARD

(75) Inventors: Chung-Yang Wu, Taipei (TW); Hung-Tao Wong, Taipei (TW)

(73) Assignee: Inventec Corporation, Taipei (TW)

( * ) Notice: Subject to any disclaimer, the term of this patent is extended or adjusted under 35 U.S.C. 154(b) by 905 days.

(21) Appl. No.: 12/690,603

(22) Filed: Jan. 20, 2010

(65) Prior Publication Data
US 2011/0173808 A1    Jul. 21, 2011

(51) Int. Cl.
*H05K 3/20* (2006.01)

(52) U.S. Cl.
USPC ......... 29/831; 29/832; 29/840; 29/841; 29/851; 29/854; 174/259; 174/260; 438/103; 438/106; 438/108; 438/112; 438/118; 716/110; 716/111; 716/119; 716/137

(58) Field of Classification Search
USPC ......... 29/831, 832, 840, 841, 844, 846, 29/851, 854; 174/259, 260; 156/64, 356, 156/357, 358; 438/103, 106, 108, 112, 118, 438/119, 127; 716/137, 106, 110, 111, 119
See application file for complete search history.

(56) References Cited

U.S. PATENT DOCUMENTS

| | | | | |
|---|---|---|---|---|
| 5,172,303 | A  * | 12/1992 | Bernardoni et al. | 361/744 |
| 6,687,985 | B2 * | 2/2004 | Sakamoto et al. | 29/830 |
| 7,783,998 | B2 * | 8/2010 | Oggioni | 716/122 |
| 7,834,273 | B2 * | 11/2010 | Takahashi et al. | 257/774 |

* cited by examiner

*Primary Examiner* — Paul D Kim
(74) *Attorney, Agent, or Firm* — Morris Manning & Martin LLP; Tim Tingkang Xia, Esq.

(57) ABSTRACT

A layout method for electronic components of a double-sided surface mount circuit board is presented, which includes the following steps. At least one first electronic component is fixed on a first side surface of a circuit board through a reflow soldering process. At least one second electronic component is inserted on the first side surface of the circuit board. The other first electronic component is placed on a second side surface of the circuit board, and the other second electronic component is inserted on the second side surface of the circuit board. Finally, a reflow soldering process is performed on the circuit board disposed with the first electronic components and the second electronic components, thereby completing a layout process for the electronic components on the two side surfaces of the circuit board at the same time.

8 Claims, 9 Drawing Sheets

LAYOUT METHOD FOR ELECTRONIC COMPONENTS OF DOUBLE-SIDED SURFACE MOUNT CIRCUIT BOARD

BACKGROUND OF THE INVENTION

1. Field of the Invention

The present invention relates to a layout method for electronic components of a circuit board, and more particularly to a layout method for electronic components of a double-sided surface mount circuit board.

2. Related Art

A printed circuit board (PCB), serving as an electrical carrier board, is capable of gathering a plurality of electronic components to form a circuit system having integral functions, so that the PCB is an indispensable basic component for all types of electronic products.

In order to miniaturize the electronic products and enhance the reliability thereof, recently, the electronic components are combined to the circuit board through a surface mount technology (SMT) instead of a conventional combination manner of perforation and insertion. The electronic components can be quickly mounted on the PCB through the SMT, thereby achieving the advantages of high functional density, light weight, low inductance-capacitance and impedance, lower production cost, and the like. Therefore, the SMT is widely applied to electronic telecommunications, high frequency circuits, communication systems, aeronautics, household appliances, mechanics, and other fields.

In order to further simplify the layout design on the PCB and improve the unit density of the PCB, a double-sided SMT of the PCB is developed.

A conventional double-sided surface mount process of the PCB mainly has the following steps. A paste is first printed on a pre-determined position of a circuit board. Then, a surface mount device (SMD) is placed on the printed paste. A reflow soldering process is performed on the circuit board disposed with the SMD, so that the paste on the circuit board is melted, and wires on the SMD are soldered on the circuit board, thereby completing the fabrication process on one side of the circuit board. Afterward, the circuit board is turned over to have the other side without the SMD facing upwards, and the same surface mount process is repeated to complete the double-sided surface mount process of the PCB.

Although the conventional double-sided surface mount process can successfully fix the SMDs on the two side surfaces of the PCB respectively, the process is inapplicable to specific electronic components, for example, electronic devices in the form of a plated through hole (PTH).

Particularly, if a PTH device is formed in advance on one side of the PCB, when the other side of the PCB is handled in the double-sided surface mount process, the height of the soldered PTH device is different from that of the SMD, which may result in a tin pick-up problem when the PTH device passes through a wave solder tin oven.

Therefore, the PTH device needs to be additionally soldered manually, such that the conventional double-sided surface mount process of the PCB becomes rather complicated, which may give rise to limitations like the processing time cannot be effectively shortened, the manufacturing cost cannot be lowered, and the product quality cannot be stably maintained.

SUMMARY OF THE INVENTION

Accordingly, the present invention is a layout method for electronic components of a double-sided surface mount circuit board, so as to solve the problems of a conventional double-sided surface mount process of a PCB that an SMD and a PTH device cannot be formed on two side surfaces of the PCB at the same time, and such a process is too complicated and may result in a long processing time, high manufacturing cost, and difficulty in maintaining the processing quality.

The present invention provides a layout method for electronic components of a double-sided surface mount circuit board, which comprises the following steps. A circuit board having a first side surface and a second side surface opposite to each other is first provided, and the circuit board has at least two through holes penetrating the first side surface and the second side surface. A plurality of first electronic components and at least two second electronic components are also provided. At least one first solder pad is printed on the first side surface of the circuit board, and at least one of the first electronic components is placed on the first solder pad. A first reflow soldering process is then performed on the circuit board disposed with the first electronic component, and the first electronic component is fixed on the first side surface of the circuit board.

Next, at least one second solder pad is printed on the second side surface of the circuit board, and a paste is respectively filled in the two through holes of the circuit board. One of the second electronic components is inserted in one of the through holes, and the second electronic component is disposed on the first side surface of the circuit board. At least one of the other first electronic components is placed on the second solder pad. The other second electronic component is inserted in the other through hole, and the second electronic component is disposed on the second side surface of the circuit board. Finally, a second reflow soldering process is performed on the circuit board disposed with the first electronic component and the second electronic components, and the first electronic component and the second electronic components are fixed on the first side surface and the second side surface of the circuit board.

The present invention achieves the following efficacies. The fabrication process of the present invention is applicable to the layout of specific electronic components on the circuit board, and the layout of electronic components in different forms on the two opposite side surfaces of the circuit board can be completed at the same time through only one reflow soldering process, thereby greatly simplifying the fabrication process, shortening the processing time, and largely reducing the manufacturing cost.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
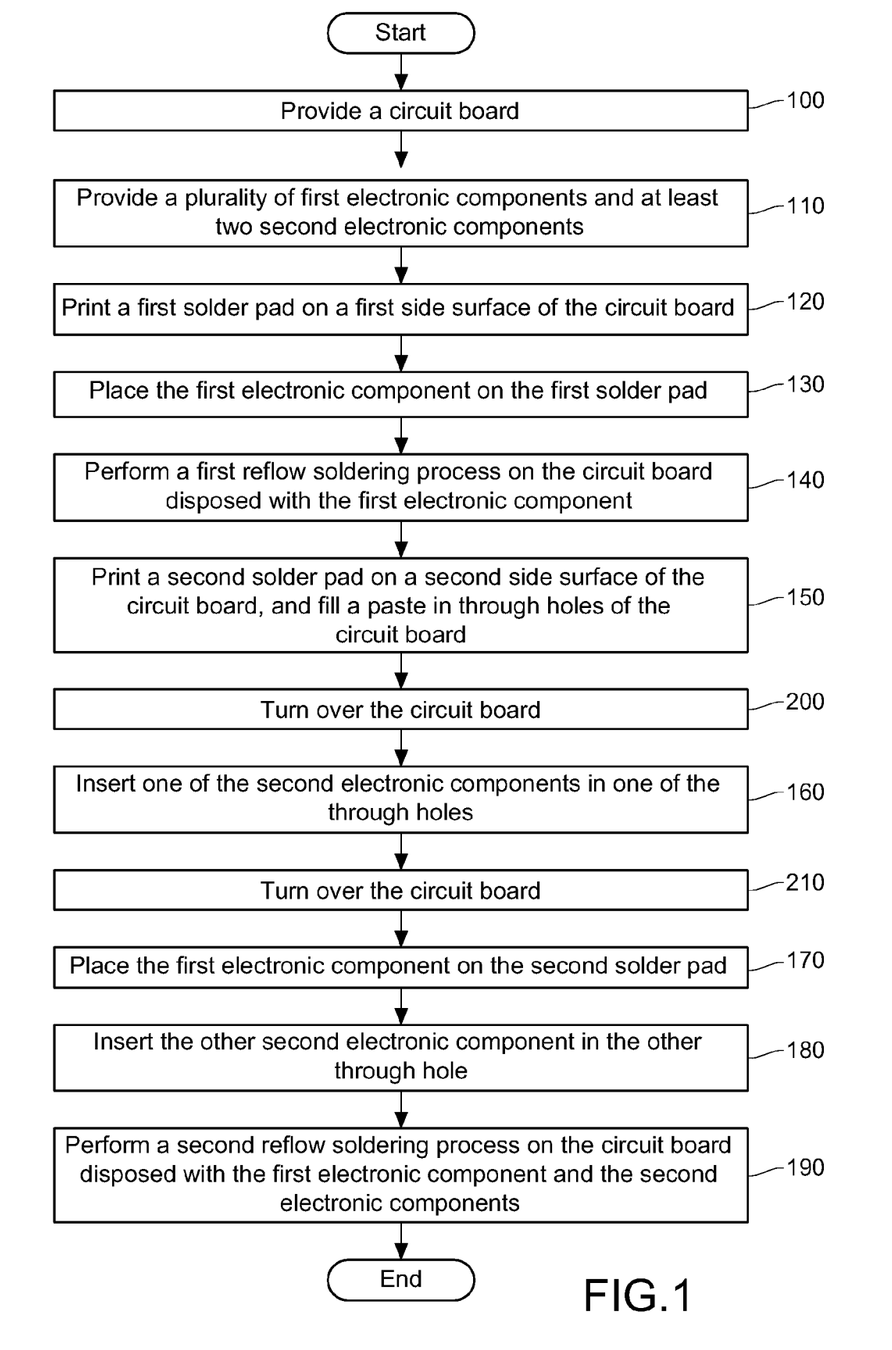
FIG. 1 is a flow chart of a process according to the present invention.

FIG. 1 is a flow chart of a process according to an embodiment of the present invention, and FIGS. 2A to 2H are schematic views of detailed steps in the process according to the embodiment of the present invention.

Figure 2A:
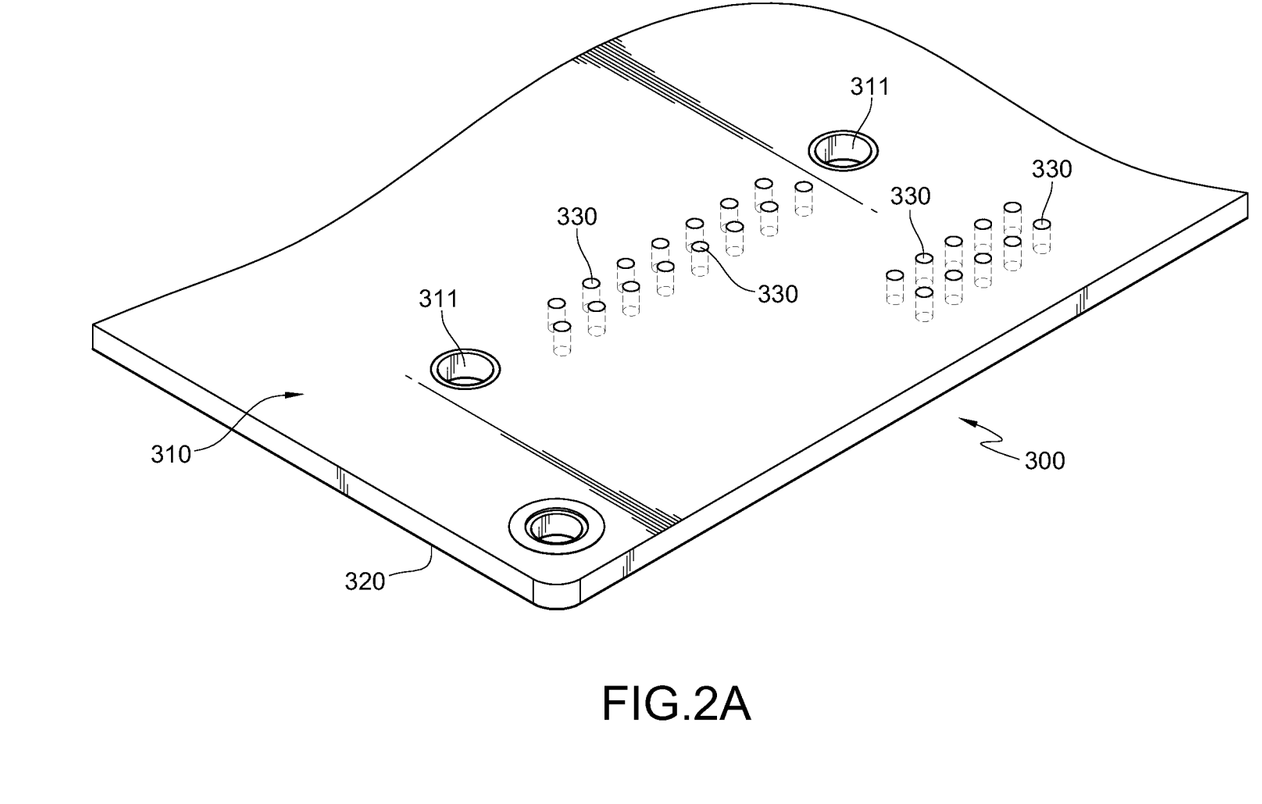
FIGS. 2A to 2H are schematic views of the process of a layout method for electronic components according to the present invention.

Referring to FIGS. 1 and 2A, a layout method for electronic components of a double-sided surface mount circuit board according to the present invention comprises the following steps. Firstly, a circuit board 300 is provided (Step 100), in which the circuit board 300 has a first side surface 310 and a second side surface 320 opposite to each other, and the circuit board 300 has at least two through holes 330 penetrating the first side surface 310 and the second side surface 320. The through hole 330 of this embodiment is a plated through hole (PTH), which has a metal layer plated on an inner wall and is electrically connected to electrical traces of the circuit board 300. The circuit board 300 of this embodiment is a surface mount circuit substrate, for subsequently performing a surface mount process.

Figure 2B:
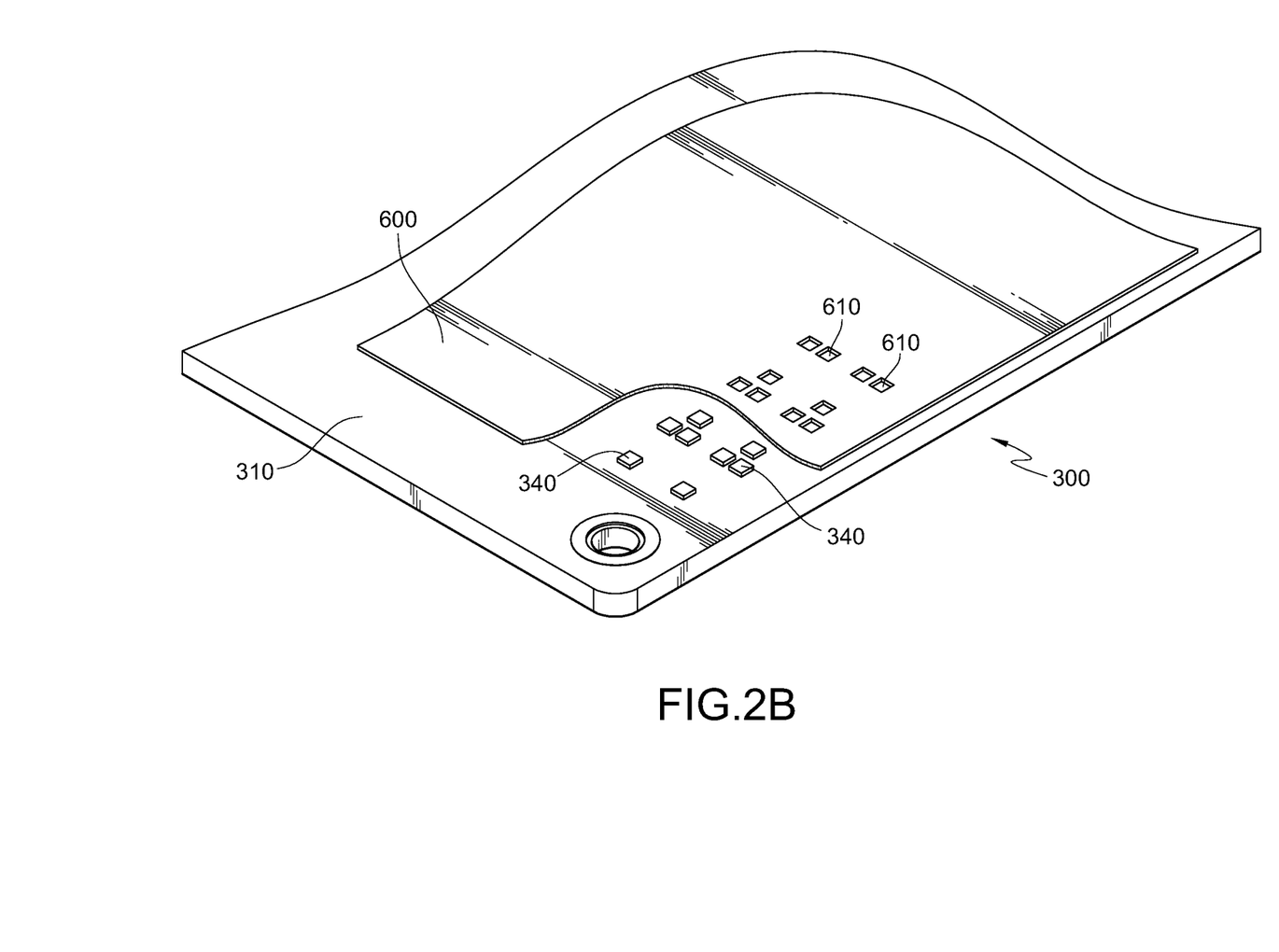
Figure 2C:
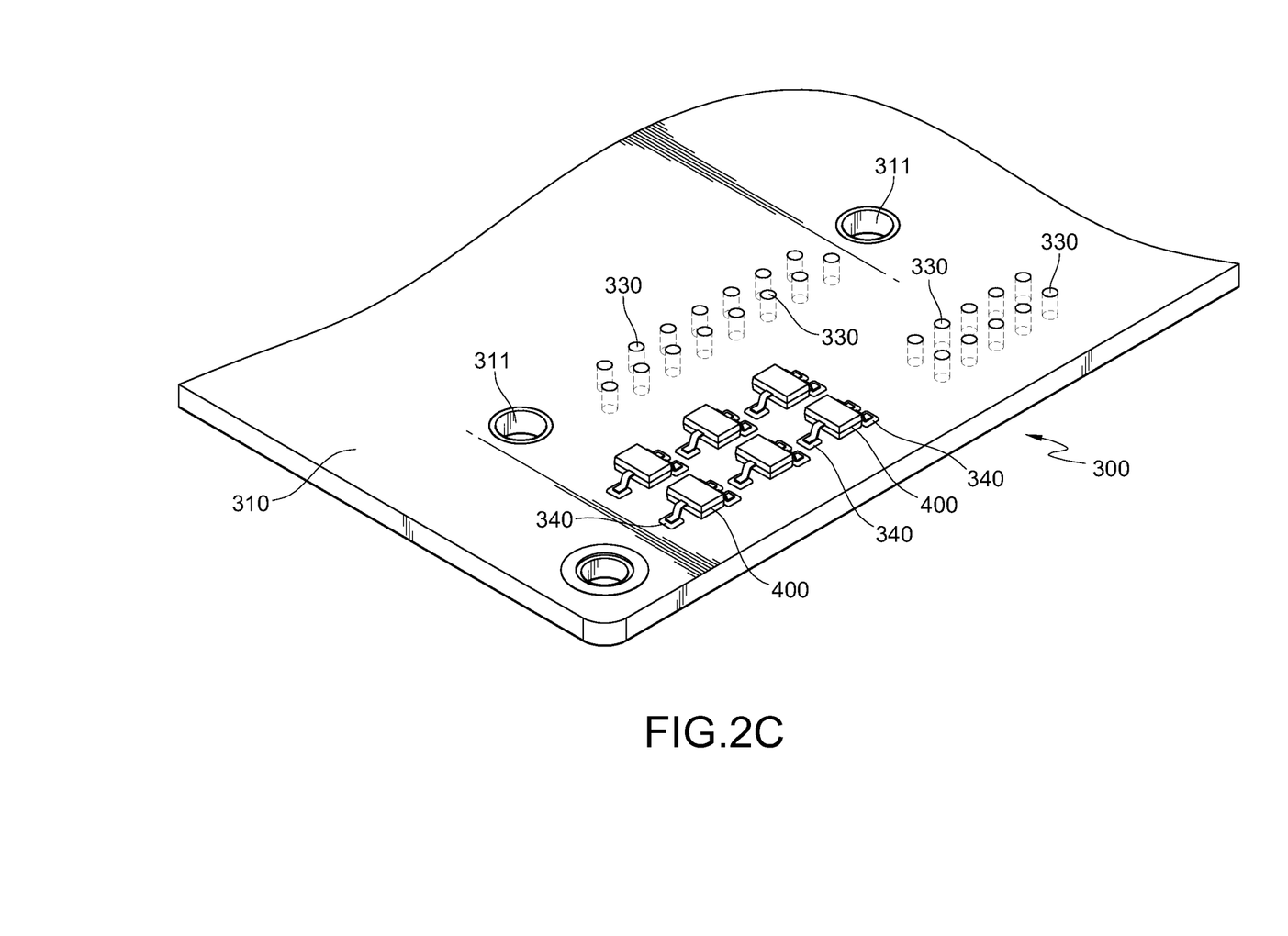
Figure 2D:
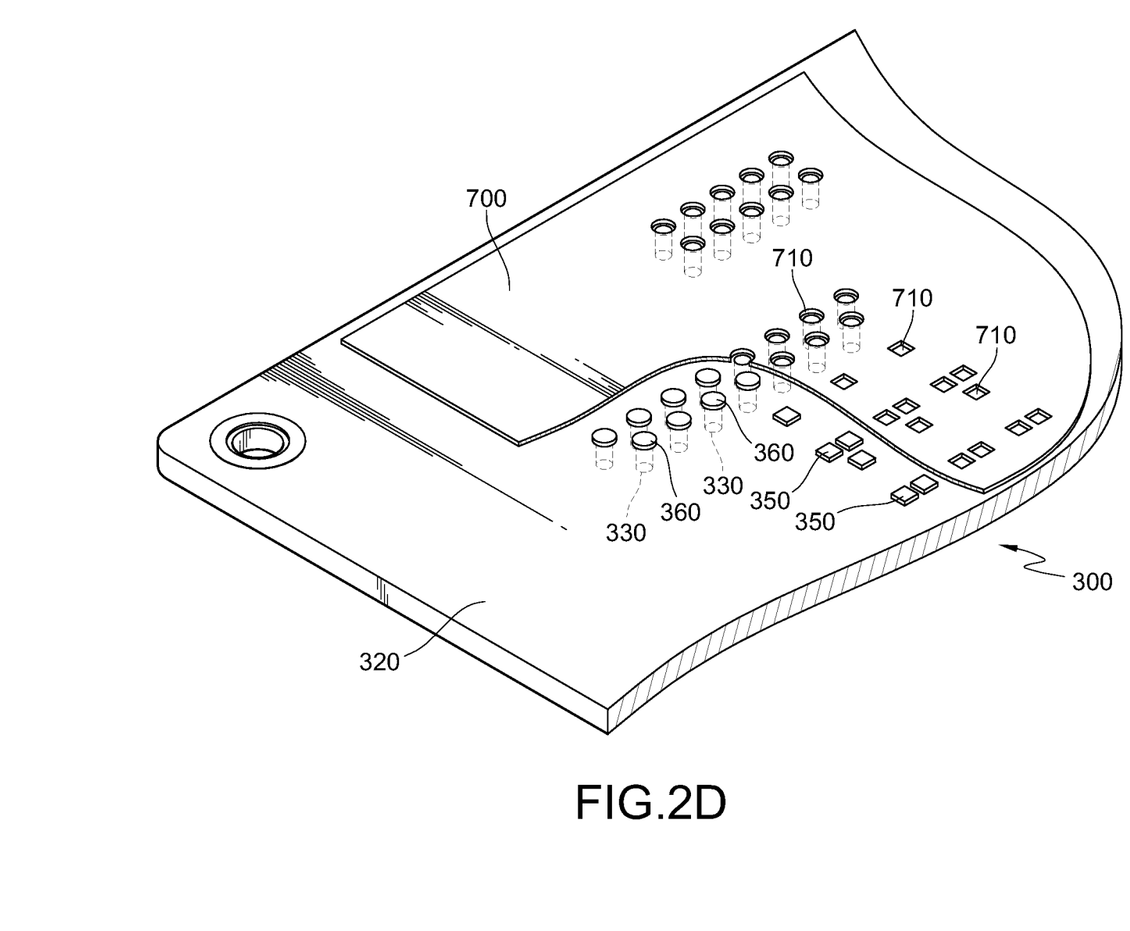
Figure 2E:
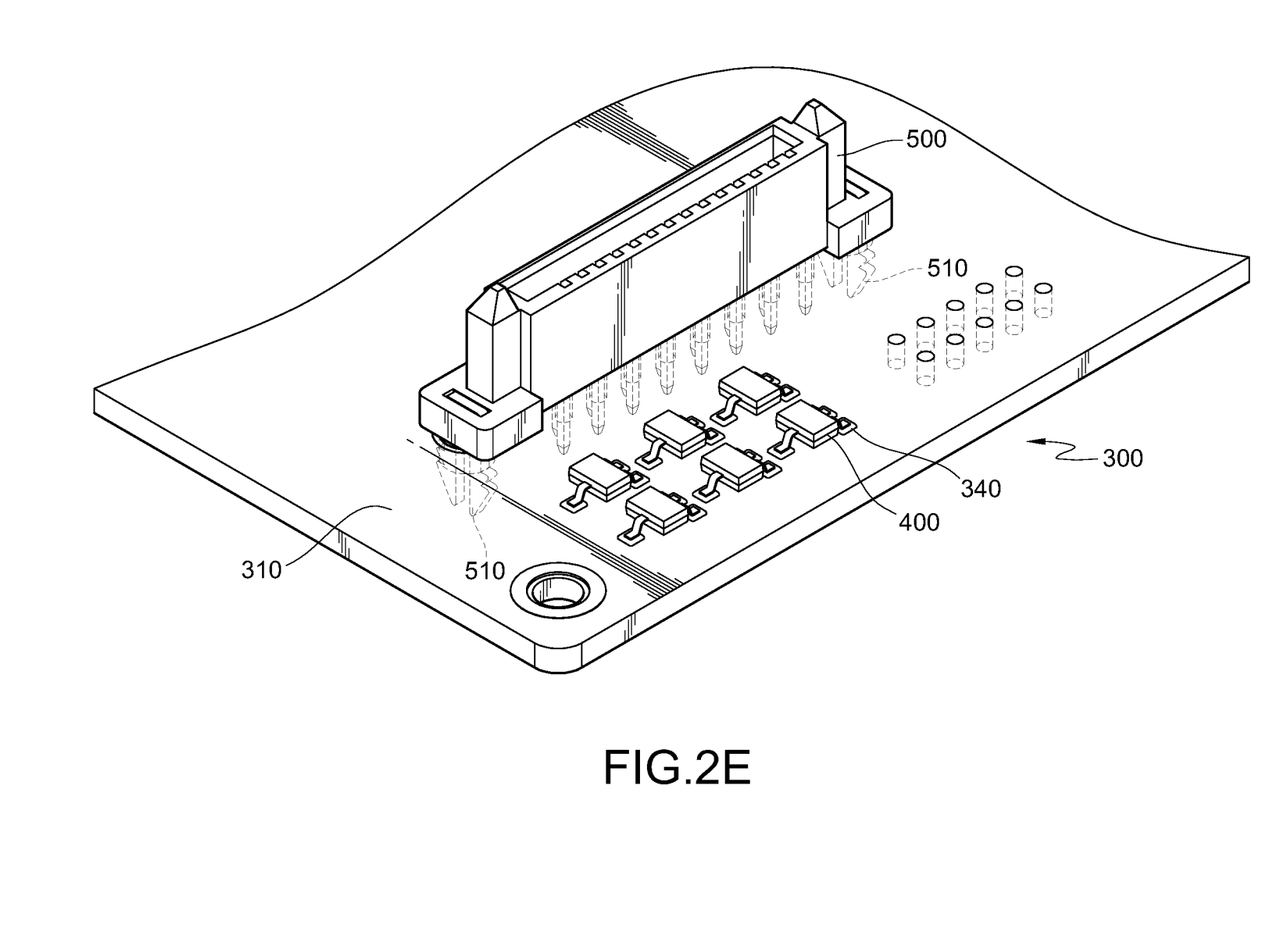

Next, a plurality of first electronic components 400 and at least two second electronic components 500 (as shown in FIGS. 2C and 2E) are provided (Step 110). In the present invention, the first electronic components 400 are SMDs, and the second electronic components 500 are electronic devices in the form of a PTH, but the present invention is not limited thereto.

Referring to FIGS. 1 and 2B, at least one first solder pad 340 is printed on the first side surface 310 of the circuit board 300 (Step 120). In the step of printing the first solder pad 340 of this embodiment, the first solder pad 340 is formed on the first side surface 310 of the circuit board 300 through a printing steel plate 600 having a plurality of openings 610 in a screen printing manner. Opened positions of the plurality of openings 610 on the printing steel plate 600 are determined according to a pre-determined position of the first solder pad 340, and the number of the first solder pad 340 also depends on the number of the first electronic components 400 to be electrically disposed on the first side surface 310 of the circuit board 300, such that the number of the first solder pad 340 may be correspondingly increased or decreased according to actual design requirements, and the present invention is not limited to this embodiment.

Referring to FIGS. 1 and 2C, at least one of the first electronic components 400 in the surface mount mode is placed on the first solder pad 340 (Step 130), and a first reflow soldering process is performed on the circuit board 300 disposed with the first electronic component 400 (Step 140), such that the first electronic component 400 is fixed on the first side surface 310 of the circuit board 300, and the first electronic component 400 is electrically conducted to the circuit board 300.

Referring to FIGS. 1 and 2D, at least one second solder pad 350 is printed on the second side surface 320 of the circuit board 300, and a paste 360 is respectively filled in the two through holes 330 of the circuit board 300 (Step 150). In the step of printing the second solder pad 350 and filling the paste 360 in the through holes 330 of this embodiment, the second solder pad 350 is formed on the second side surface 320 of the circuit board 300 through a printing steel plate 700 having a plurality of openings 710 in a screen printing manner, and the paste 360 is then filled in the through holes 330 of the circuit board 300. Opened positions of the plurality of openings 710 on the printing steel plate 700 are determined according to a pre-determined position of the second solder pad 350 and positions of the through holes 330, and the number of the second solder pad 350 also depends on the number of the second electronic components 500 to be electrically disposed on the second side surface 320 of the circuit board 300, such that the number of the disposed second solder pad 350 may be correspondingly increased or decreased according to actual design requirements, and the present invention is not limited to this embodiment.

Referring to FIGS. 1 and 2E, after the step of printing the second solder pad 350 is completed, the circuit board 300 is selectively turned over for 180 degrees through a turnover device (not shown) (Step 200), such that the first side surface 310 (that is, the side surface having the first electronic components 400 fixed thereon) of the circuit board 300 is facing upwards. Thereby, one of the second electronic components 500 in the form of the PTH is inserted in one of the through holes 330 of the circuit board 300, and is disposed on the first side surface 310 of the circuit board 300 (Step 160). Definitely, the second electronic component 500 may also be directly inserted on the first side surface 310 of the circuit board 300, and is not necessarily inserted after the circuit board 300 is turned over for 180 degrees.

Again referring to FIGS. 1 and 2E, the second electronic component 500 installed on the first side surface 310 of the circuit board 300 further has a fixing member 510, and a corresponding engagement hole 311 is opened on the first side surface 310 of the circuit board 300. The fixing member 510 is inserted in the engagement hole 311, and forms a mutually interfering relation with the engagement hole 311, such that the second electronic component 500 is stably mounted on the first side surface 310 of the circuit board 300, thereby preventing the second electronic component 500 from getting loose and falling from the through hole 330 of the circuit board 300 after the subsequent layout process is performed (for example, in the circumstance that the first side surface 310 of the circuit board 300 is turned over and facing downwards).

The fixing member 510 of this embodiment is an anchor positioning pin, and the fixing member 510 is compressed by a force to successfully pass through the engagement hole 311. After the fixing member 510 is positioned, an anchor end of the fixing member 510 returns to an uncompressed state, and buckles the circuit board 300, such that the second electronic component 500 is fixed on the first side surface 310 of the circuit board 300. However, persons skilled in the art may alter the fixing member 510 of the present invention to a fixing means in any form, and the present invention is not limited to this embodiment.

Figure 2F:
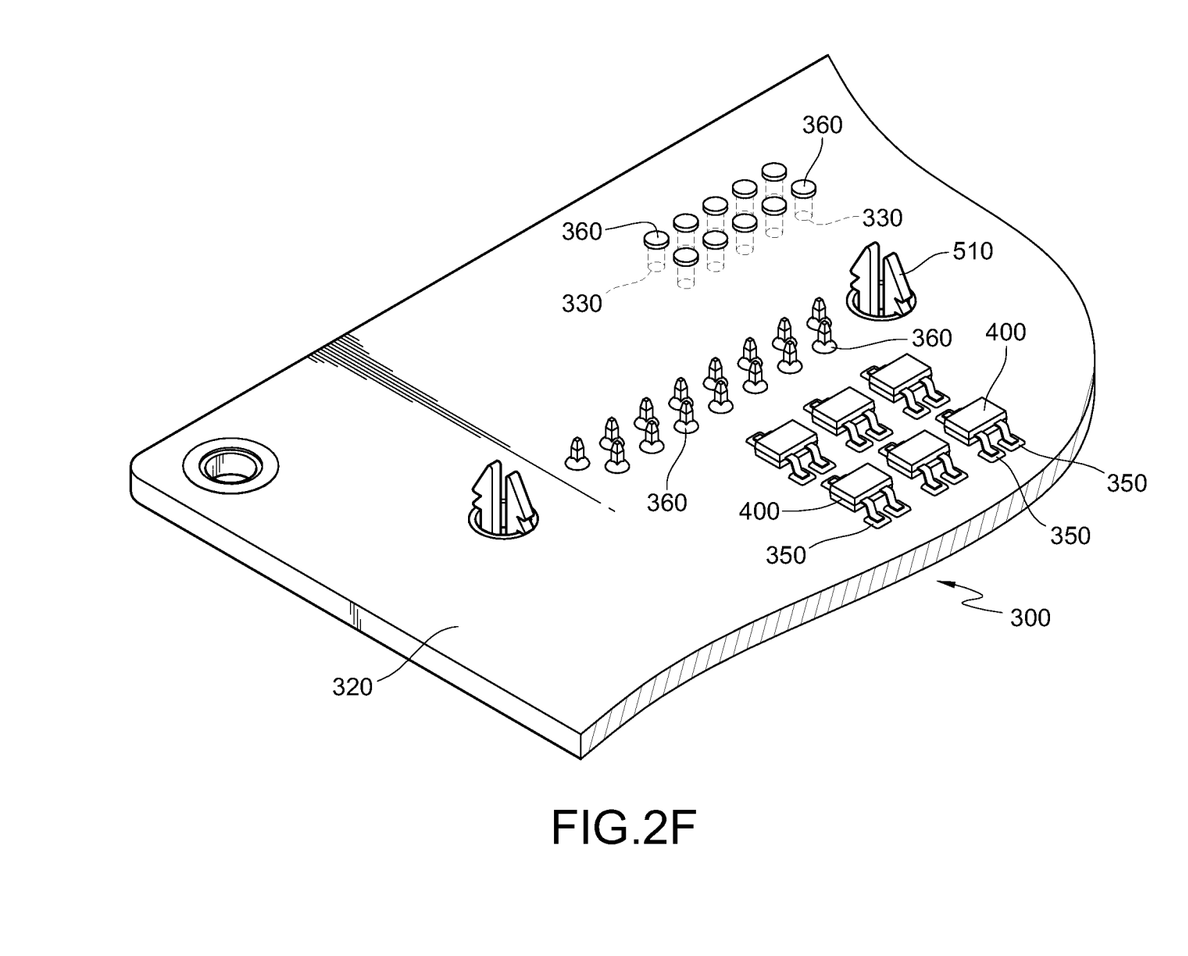

Referring to FIGS. 1 and 2F, if the circuit board 300 is turned over before the second electronic component 500 is inserted, the circuit board 300 needs to be turned over for 180 degrees again after the second electronic component 500 is inserted (Step 210), such that the second side surface 320 (that is, the side surface without the first electronic component 400 disposed thereon) of the circuit board 300 is facing upwards, for performing the subsequent process. Next, the first electronic component 400 in the surface mount mode is placed on the second solder pad 350 (Step 170).

Figure 2G:
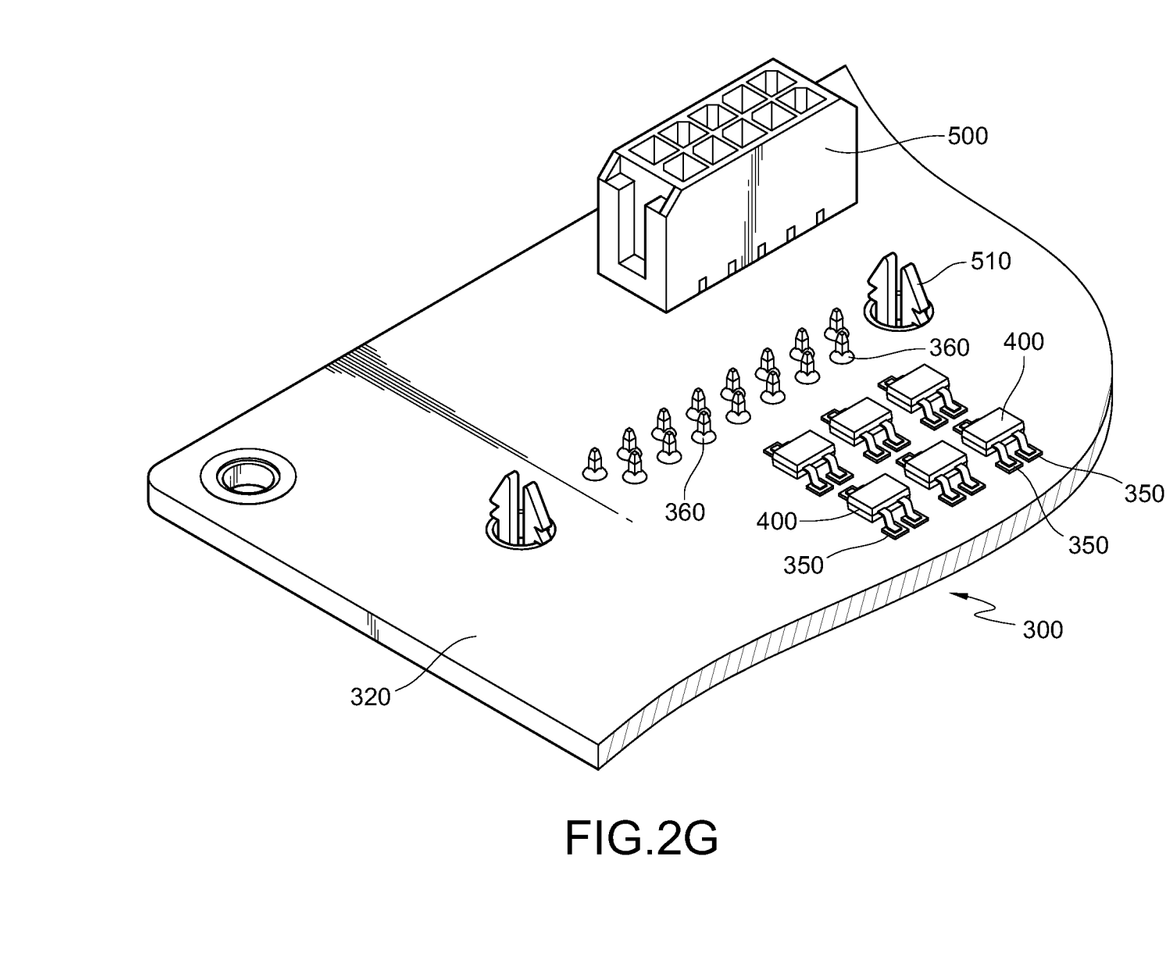

Referring to FIGS. 1 and 2G, the other second electronic component 500 in the form of the PTH is inserted in the other through hole 330 of the circuit board 300, and is disposed on the second side surface 320 of the circuit board 300 (Step 180). Finally, a second reflow soldering process is performed on the circuit board 300 disposed with the first electronic component 400 and the second electronic components 500 (Step 190), such that the first electronic component 400 is fixed on the second side surface 320 of the circuit board 300, the at least two second electronic components 500 are respectively fixed on the first side surface 310 and the second side surface 320 of the circuit board 300, and the first electronic component 400 and the second electronic components 500 are electrically conducted to the circuit board 300.

It should be noted that the layout processing sequences of the first electronic component 400 and the second electronic component 500 on the second side surface 320 of the circuit board 300 of this embodiment may be exchanged, and the present invention is not limited to the sequence of this embodiment.

Figure 2H:
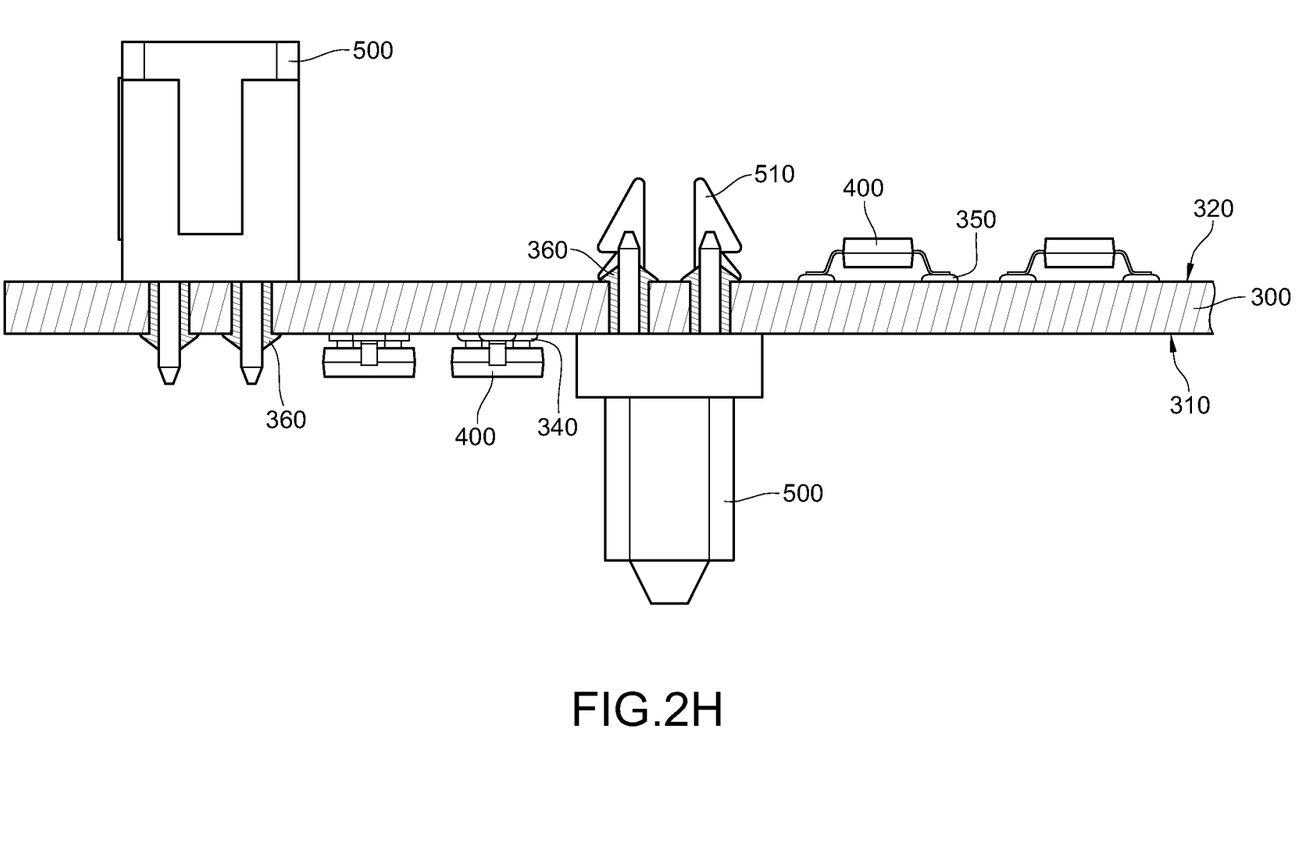

It can be clearly seen from the schematic cross-sectional structural view of FIG. 2H that the first electronic components 400 disposed on the first side surface 310 and the second side surface 320 of the circuit board 300 are combined with the melted solder pads 340 and 350, such that the first electronic components 400 and the circuit board 300 form an excellent electrical conduction relation. Further, for the second electronic components 500 inserted in the through holes 330 of the circuit board 300 and respectively disposed on the first side surface 310 and the second side surface 320, the paste 360 in the through holes 330 is melted and filled in the entire through holes 330, and is fixed on pins of the second electronic components 500, such that the second electronic components 500 and the circuit board 300 form an excellent electrical conduction relation.

Through the layout method for electronic components of a double-sided surface mount circuit board according to the present invention, electronic components in different forms are respectively fixed on two opposite side surfaces of a circuit board through different mounting technologies, for example, the first electronic component in the surface mount mode is disposed on the circuit board through the SMT, and the second electronic component in the form of the PTH is disposed on the circuit board through a pin in paste (PIP) technology. Therefore, in the double-sided surface mount process of the present invention, the layout of electronic components in different forms can be completed at the same time through only one reflow soldering process, thereby greatly simplifying the fabrication process, shortening the processing time, and largely reducing the manufacturing cost.

What is claimed is:

1. A layout method for electronic components of a double-sided surface mount circuit board, comprising:
    providing a circuit board, wherein the circuit board has a first side surface and a second side surface opposite to each other, and the circuit board has at least two through holes penetrating the first side surface and the second side surface;
    providing a plurality of first electronic components and at least two second electronic components;
    printing at least one first solder pad on the first side surface of the circuit board;
    placing at least one of the first electronic components on the at least one first solder pad;
    performing a first reflow soldering process on the circuit board disposed with the at least one of the first electronic components, and fixing the at least one of the first electronic components on the first side surface of the circuit board;
    printing at least one second solder pad on the second side surface of the circuit board, and respectively filling a paste in the two through holes of the circuit board;
    inserting one of the second electronic components in one of the through holes, wherein the one of the second electronic components is disposed on the first side surface of the circuit board;
    placing at least one of the first electronic components on the second solder pad;
    inserting another one of the second electronic components in the other through hole, wherein the another one of the second electronic components is disposed on the second side surface of the circuit board; and
    performing a second reflow soldering process on the circuit board disposed with the at least one of the first electronic components, the one of the second electronic components and the another one of the second electronic components, fixing the first electronic component on the second side surface of the circuit board, and fixing the one of the second electronic components on the first side surface of the circuit board and the another one of the second electronic components on the second side surface of the circuit board respectively.

2. The layout method for the electronic components of the double-sided surface mount circuit board according to claim 1, wherein before the step of inserting one of the second electronic components in one of the through holes, the method further comprises turning over the circuit board.

3. The layout method for the electronic components of the double-sided surface mount circuit board according to claim 1, wherein before the step of placing at least one of the first electronic components on the second solder pad, the method further comprises turning over the circuit board.

4. The layout method for the electronic components of the double-sided surface mount circuit board according to claim 1, wherein the one of the second electronic components is fixed on the first side surface of the circuit board through a fixing member.

5. The layout method for the electronic components of the double-sided surface mount circuit board according to claim 1, wherein in the step of printing the at least one first solder pad on the first side surface of the circuit board, the at least one first solder pad is formed on the circuit board through a printing steel plate in a screen printing manner.

6. The layout method for the electronic components of the double-sided surface mount circuit board according to claim 5, wherein the printing steel plate has a plurality of openings correspondingly formed according to a position of the at least one first solder pad.

7. The layout method for the electronic components of the double-sided surface mount circuit board according to claim 1, wherein in the step of printing the at least one second solder pad on the second side surface of the circuit board and respectively filling the paste in the two through holes of the circuit board, the at least one second solder pad is formed on the circuit board through a printing steel plate in a screen printing manner.

8. The layout method for the electronic components of the double-sided surface mount circuit board according to claim 7, wherein the printing steel plate has a plurality of openings correspondingly formed according to a position of the at least one second solder pad and positions of the two through holes.

* * * * *